United States Patent [19]

Macey

[11] 3,714,602

[45] Jan. 30, 1973

[54] AMPLIFIER CIRCUIT HAVING A CONTROLLABLE GAIN

[75] Inventor: Frank G. Macey, Shrewsbury, Mass.

[73] Assignee: Servo Corporation of America, Hicksville, N.Y.

[22] Filed: Nov. 12, 1970

[21] Appl. No.: 88,595

[52] U.S. Cl. ....................330/86, 330/35

[51] Int. Cl. ....................H03f 1/36

[58] Field of Search ....................330/86, 30 D, 69, 35

[56] References Cited

UNITED STATES PATENTS

| | | | |
|---|---|---|---|
| 3,178,698 | 4/1965 | Graham | 330/86 X |
| 3,588,729 | 6/1971 | Satterfield | 330/35 |
| 3,569,603 | 3/1971 | Kern | 330/86 X |
| 3,373,959 | 3/1968 | Petersen | 330/86 X |
| 3,552,428 | 1/1971 | Pemberton | 330/86 X |
| 3,106,684 | 10/1963 | Luik | 330/86 X |
| 3,458,821 | 7/1969 | Clarridge | 328/1 |

*Primary Examiner*—Nathan Kaufman

*Attorney*—David S. Kane, Daniel H. Kane, Philip T. Dalsimer, Joseph C. Sullivan, John Kurucz, James J. Salerno, Jr., Martin E. Goldstein, Charles R. Hoffmann, Gerald Levy, Charles P. Bauer, Peter Saxon and Peter C. Van Der Sluys

[57] ABSTRACT

A signal amplifying circuit including an operational amplifier and a single field effect transistor for controlling the gain of the operational amplifier while producing minimal DC offset voltage at the output of the operational amplifier. The operational amplifier is capable of producing amplified output signals from dc to the megahertz range.

1 Claim, 1 Drawing Figure

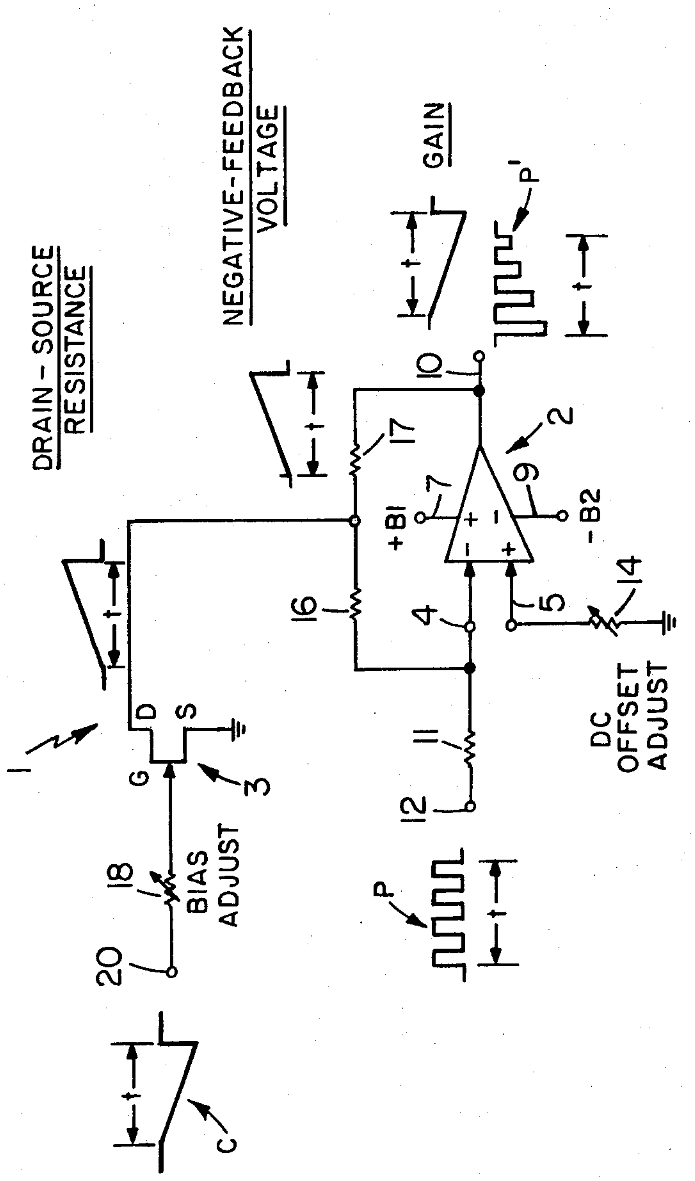
INVENTOR.
FRANK G. MACEY
BY
Peter Xiarhos

AMPLIFIER CIRCUIT HAVING A CONTROLLABLE GAIN

BACKGROUND OF THE INVENTION

The present invention relates to an amplifier circuit having a controllable gain. More particularly, it is concerned with a wideband signal amplifying circuit including an operational amplifier and a variable-resistance device such as a field effect transistor for controlling the gain of the operational amplifier while achieving minimal DC offset voltage at the output of the operational amplifier.

The use of variable-resistance devices such as field effect transistors for controlling the gain of operational amplifier circuits is well known to those skilled in the art. For example, it is presently known to employ a pair of field effect transistors, one in series with each of the input terminals (inverting and non-inverting input terminals) of an operational amplifier, and to apply a control voltage signal in common to both of the field effect transistors for controlling the resistance values of the field effect transistors and, therefore, to control the gain of the operational amplifier. More specifically, the resistance values of the field effect transistors are determined by the value of the control voltage signal. As a result, input signals applied to one of the field effect transistors are amplified by the operational amplifier by an amount determined by the value of the control voltage signal applied to the field effect transistors. While the above-described arrangement operates in a generally satisfactory manner, to achieve minimal DC offset voltage at the output terminal of the operational amplifier requires that the field effect transistors be closely matched so that variations in the two field effect transistors during their operation cancel each other. Since the above matching of field effect transistors is time consuming and, thus, costly, the use of matched field effect transistors is often impractical and therefore to be avoided in applications where low cost is an important consideration.

In addition to the above-described arrangement, it has been known to employ a single field effect transistor for controlling the gain of an operational amplifier. Typically, the field effect transistor is placed in series with one of the input terminals of the operational amplifier and a control voltage is applied to the field effect transistor to control its resistance value and, therefore, to control the gain of the operational amplifier. As in the previous example, the resistance value of the field effect transistor is determined by the value of the control voltage signal. As a result, input signals applied to the field effect transistor are amplified by the operational amplifier by an amount determined by the value of the control voltage signal applied to the field effect transistor. Although the above-described arrangement is suitable for use in many applications, it produces a rather substantial DC offset voltage (e.g. 1–2 volts) at the output terminal of the operational amplifier when an input signal having a DC component is applied to the operational amplifier. This large-valued DC offset voltage is undesirable in applications where it is necessary or desirable to keep the DC offset voltage at a small value, for example, of the order of millivolts. Thus, to eliminate this DC offset voltage, additional circuit elements are required, thereby adding to overall costs and, by virtue of eliminating the DC offset voltage, reducing the bandwidth of the operational amplifier from its maximum possible value. By way of example, the bandwidth of the operational amplifier may be reduced from a typical value of DC to 1 Megahertz to a value of 100 hertz to 1 Megahertz.

BRIEF SUMMARY OF THE INVENTION

In accordance with the present invention, an amplifier circuit is provided which has a controllable gain. The amplifier circuit includes an amplifier circuit means having an input terminal and an output terminal. In accordance with the invention, a feedback means provides a feedback voltage between the output terminal and the input terminal of the amplifier circuit means. An input signal to be amplified is received at an input signal terminal of the amplifier circuit of the invention and is coupled by a coupling means from the input signal terminal to the input terminal of the amplifier circuit means. In addition to the above-mentioned elements, a control input terminal is provided which is adapted to receive a control signal condition, and a control circuit means is coupled to the control input terminal and also to the feedback means.

In the operation of the amplifier circuit of the invention, the control circuit means operates in response to a control signal condition at the control input terminal to change the value of the feedback voltage between the output terminal and the input terminal of the amplifier circuit means. As a result of the change in the value of the feedback voltage between the output terminal and the input terminal of the amplifier circuit means, the amplifier circuit means operates in response to an input signal at the input terminal thereof to produce an output signal at the output terminal thereof amplified by a value of gain determined by the amount of change in the value of the feedback voltage between the output and input terminals.

BRIEF DESCRIPTION OF THE DRAWING

The single FIGURE of the drawing illustrates an amplifying circuit including an operational amplifier and a field effect transistor in accordance with a preferred form of the present invention.

GENERAL DESCRIPTION OF THE INVENTION

Referring to the single FIGURE, there is shown an amplifying circuit 1 in accordance with a preferred form of the present invention. As shown in the FIGURE, the amplifying circuit 1 includes an operational amplifier 2 and a single field effect transistor 3. The operational amplifier 2, which may be one of several well-known commercially-available linear differential amplifiers (for example, Fairchild μA709), includes, in a conventional fashion, an inverting input terminal 4, a non-inverting input terminal 5, a positive bias terminal 7, a negative bias terminal 9, and an output terminal 10. The inverting input terminal 4 of the operational amplifier 2 is coupled via an input resistor 11 to an input terminal 12. Signals to be amplified by the operational amplifier 2, such as the positive pulse train P shown in the FIGURE, are applied to the aforementioned input terminal 12 and coupled by the input resistor 11 to the inverting input terminal 4 of the operational amplifier 2. The non-inverting input terminal of the operational amplifier 2 is coupled to a variable DC offset adjust resistor 14. The variable DC offset adjust resistor 14 is adjusted to prevent any initial, large-valued DC voltage level, for example, 1–2 volts DC, which may be present in signals applied to the input terminal 12, and coupled by the input resistor 11 to the inverting input terminal 4 of the operational amplifier 2, from appearing at the output terminal 10. In other words, the variable DC offset adjust resistor 14 is adjusted to prevent the presence of an initial, large-valued DC offset voltage at the output terminal 10 of the operational amplifier 2. In the case where an input signal is applied to the input terminal 12 which has no DC component, as in the case of the pulse train P shown in the FIGURE, the variable DC offset adjust resistor 14 may be replaced with a resistor of fixed value which serves to prevent any small-valued DC offset voltage (e.g., 10 millivolts), due to the operation of the operational amplifier 2 itself, from appearing at the output terminal 10.

The positive bias terminal 7 of the operational amplifier 2 is connected to a positive DC voltage source +B1, and the negative bias terminal 9 is connected to a negative DC voltage source –B2. In addition to the above circuit connections, a pair of series voltage-divider resistors 16 and 17 is connected between the inverting input terminal 4 and the output terminal 10 of the operational amplifier 2 for establishing a negative-feedback path between the output terminal 10 and the inverting input terminal 4.

The field effect transistor 3 employed in the amplifying circuit 1, of the n-type, includes a gate electrode G, a drain electrode D, and a source electrode S. As shown in the FIGURE, the gate electrode G of the field effect transistor 3 is coupled via a variable bias adjust resistor 18 to a control input terminal 20. The drain electrode D is connected directly to the juncture of the voltage-divider resistors 16 and 17, and the source electrode S is connected directly to ground potential. A control signal, such as a negative ramp pulse C shown in the FIGURE, is applied to the control input terminal 20 and, as will be described in greater detail hereinafter, serves to control the value of resistance of the field effect transistor 3 which, in turn, controls the value of gain of the operational amplifier 2. The value of the variable bias adjust resistor 18 is selected to establish a bias voltage between the gate electrode G and the source electrode S of the field effect transistor 3 which is sufficient to cause the field effect transistor 3 to operate in the linear range of its drain-source resistance characteristic curve during operation of the amplifying circuit 1.

OPERATION

In the operation of the amplifying circuit 1, the negative ramp control pulse C applied to the control input terminal 20 is coupled via the bias adjust resistor 18 to the gate electrode G of the field effect transistor 3, and the positive pulse train P applied to the input terminal 12 is coupled via the input resistor 11 to the inverting input terminal 4 of the operational amplifier 2. To simplify the discussion of the amplifying circuit 1, the control pulse C and the pulse train P are each illustrated in the FIGURE as having a time duration *t*. It is to be appreciated, however, that in other applications of the amplifying circuit 1, the time durations of the control pulse C and the pulse train P may be different from each other. In addition, in other applications of the amplifying circuit 1, the signals applied to the control input terminal 20 and the input terminal 12 may take forms other than the specific forms shown for the control pulse C and the pulse train P.

The field effect transistor 3 operates in response to the negative ramp control pulse C applied to its gate electrode G to vary the value of its drain-source resistance in accordance with the variations in the amplitude of the control pulse C. More specifically, the value of the drain-source resistance of the field effect transistor 3 increases progressively from a first, minimum value to a second, maximum value as the value of the control pulse C progressively decreases from a first value to a second value, and then decreases from the maximum value back to the minimum value after the time duration *t* as the value of the control pulse C increases from the second value back to the first value after the time duration *t*. As the above resistance variation takes place, the value of the negative feedback voltage of the operational amplifier 2 is altered at the juncture of the voltage-divider resistors 16 and 17 in a similar manner to the operation of the field effect transistor 3. That is, the value of the negative feedback voltage at the juncture of the voltage-divider resistors 16 and 17 increases progressively from a first, minimum value to a second, maximum value, and then decreases from the maximum value back to the minimum value after the time duration *t*. As a result of the above operation, the gain of the operational amplifier 2 decreases progressively from a first, maximum value to a second, minimum value, and then from the minimum value back to the maximum value after the time duration *t*. As indicated in the FIGURE, the value of the gain of the operational amplifier 2 varies in accordance with the variations in the value of the control pulse C. Accordingly, for the particular gain characteristic shown for the operational amplifier circuit 2 in the FIGURE, the input square-wave pulse train P at the inverting input terminal 4 of the operational amplifier 2 is inverted and amplified by the operational amplifier 2 over the time duration *t* by a progressively decreasing value of gain. Assuming a minimum value of gain for the operational amplifier 2 greater than one, an exemplary form of the output pulse train produced at the output terminal 10 of the operational amplifier 2 for the particular input pulse train P and for the particular control pulse C is shown at P′ in the FIGURE.

MODIFICATIONS

Although a specific amplifying circuit 1 employing a field effect transistor 3 and associated biasing resistor 18 has been described hereinabove, it is to be appreciated that other arrangements may be used in place of the field effect transistor 3 and the biasing resistor 18 for controlling the gain of the operational amplifier 2. For example, an optical arrangement including a controlled light source and a variable-resistance photoresponsive device may be employed wherein the resistance of the variable-resistance photoresponsive device is varied in accordance with variations in the light output of the controlled light source. Other modifications and changes will be obvious to those skilled in the art without departing from the invention as called for in the claims.

What is claimed is:

1. An amplifier circuit having a controllable gain, comprising:

an input signal terminal adapted to receive an input signal to be amplified, said signal including an initial DC component;

linear differential amplifier means having a first input terminal, a second input terminal and an output terminal;

coupling means for coupling an input signal at the input signal terminal to the first input terminal of the linear differential amplifier means;

feedback means including a pair of series-connected resistances connected between the output terminal and the input terminal of the linear differential amplifier means for providing a feedback voltage between the output terminal and the input terminal of the linear differential amplifier means;

a control input terminal adapted to receive a control signal condition;

a field effect transistor having a first electrode connected to the juncture of the pair of series-connected resistances, a second electrode, and a third electrode;

bias means coupled to the control input terminal and to the second electrode of the field effect transistor for establishing a bias voltage between the second and third electrodes of the field effect transistor which is sufficient to cause the field effect transistor to operate in the linear range of the resistance characteristic curve of resistance between the first and third electrodes of the field effect transistor when a control signal condition is at the control input terminal;

said field effect transistor being operative when a control signal condition is at the control input terminal to change the value of the voltage at the juncture of the pair of series-connected resistances thereby to change the value of the feedback voltage between the output terminal and the input terminal of the linear differential amplifier means;

said linear differential amplifier means being operative when the feedback voltage between its output terminal and its input terminal is changed by the field effect transistor and when an input signal is at its input terminal to produce an output signal at its output terminal amplified by a value of gain determined by the amount of change in the value of the feedback voltage between its output and input terminals;

a source of reference potential; and means coupled to the second input terminal of the linear differential amplifier means and to the source of reference potential for preventing the occurrence of an initial DC offset voltage at the output terminal of the linear differential amplifier means when an input signal having an initial DC component is present at the first-mentioned input terminal thereof.

* * * * *